US007545364B2

(12) United States Patent
Krzyzanowski et al.

(10) Patent No.: US 7,545,364 B2
(45) Date of Patent: Jun. 9, 2009

(54) MULTI-FUNCTIONAL CONTROL INTERFACE

(75) Inventors: Paul Krzyzanowski, Flemington, NJ (US); Justin Flores, Boca Raton, FL (US)

(73) Assignee: OpenPeak Inc., Boca Raton, FL (US)

( * ) Notice: Subject to any disclaimer, the term of this patent is extended or adjusted under 35 U.S.C. 154(b) by 13 days.

(21) Appl. No.: 11/594,860

(22) Filed: Nov. 9, 2006

(65) Prior Publication Data

US 2007/0102203 A1 May 10, 2007

Related U.S. Application Data

(60) Provisional application No. 60/735,149, filed on Nov. 10, 2005.

(51) Int. Cl.
*G06F 3/02* (2006.01)
*H03M 11/00* (2006.01)

(52) U.S. Cl. .......................... 345/170; 345/172; 341/23

(58) Field of Classification Search ................. 345/156, 345/168–172
See application file for complete search history.

(56) References Cited

U.S. PATENT DOCUMENTS

| | | | | |
|---|---|---|---|---|
| 5,542,770 | A | 8/1996 | Lin | |
| 6,067,074 | A | 5/2000 | Lueders | |
| 6,789,359 | B2 | 9/2004 | Bauman et al. | |
| 6,798,359 | B1 * | 9/2004 | Ivancic | 341/23 |
| 7,250,898 | B2 * | 7/2007 | Higginson | 341/176 |
| 2004/0041780 | A1 | 3/2004 | Ko | |
| 2005/0116930 | A1 | 6/2005 | Gates | |
| 2005/0200598 | A1 | 9/2005 | Hayes et al. | |
| 2005/0249364 | A1 | 11/2005 | Makino et al. | |
| 2005/0250547 | A1 * | 11/2005 | Salman et al. | 455/566 |
| 2006/0245808 | A1 | 11/2006 | Salman et al. | |
| 2007/0045093 | A1 | 3/2007 | Katsumoto et al. | |
| 2007/0152965 | A1 | 7/2007 | Krzyzanowski et al. | |

OTHER PUBLICATIONS

International Search Report for Appln. No. PCT/US08/03226 mailed Jun. 11, 2008, nine (9) pages.
Search Report for PCT Application No. PCT/US06/43527 mailed Jan. 22, 2008, 9 pgs.
Non-Final Office Action for U.S. Appl. No. 11/724,272, mailed Oct. 2, 2008, eight (8) pgs.

* cited by examiner

*Primary Examiner*—Duc Q Dinh
(74) *Attorney, Agent, or Firm*—Sterne, Kessler, Goldstein & Fox, P.L.L.C.

(57) ABSTRACT

A system and method are used to provide a user control interface for controlling multiple device functionality. The system comprises a support structure, control regions, depressible interaction devices, and a controller. The control regions are formed on the support structure. Each of the control regions comprises light emitting areas. The depressible interaction devices cover respective ones of the control regions. The controller is coupled to the control regions and controls which of the emitting areas is output from respective ones of the interaction devices based on one or more modes of operation of the user control interface.

3 Claims, 11 Drawing Sheets

MULTI-FUNCTIONAL CONTROL INTERFACE

CROSS REFERENCE TO RELATED APPLICATIONS

This application claims priority under 35 U.S.C. § 119(e) to U.S. Provisional Patent Application No. 60/735,149, filed Nov. 10, 2005, which is incorporated by reference herein in its entirety.

BACKGROUND

1. Field of the Invention

The present invention relates generally to a user control interface, and in particular, a system and method for providing an interface for controlling multiple device functionality.

2. Background

The consumer electronics (CE) industry has experienced a trend in which fewer devices are providing greater capabilities and functionality. For example, personal digital assistants (PDAs), while originally designed to store and organize personal information, are now providing additional functionality normally provided by other devices, such as voice telephony. The integration of phone functionality on a PDA provides for device consolidation and eliminates the need for the user to carry both a PDA and a separate portable phone.

However, a disadvantage of such "combo" or "multiple-in-1" devices is that a different interface/control set may be required to operate and control each separate component or device. In the case of the PDA/phone device, one interface is necessary for controlling the PDA functionality and another interface is necessary to control the telephony functionality. This is because small CE devices do not have the physical space for a separate dedicated control interface for each device.

One method of addressing the "interface real-estate" problem is to use touch screens displaying computer-generated graphic user interfaces (GUIs). A single touch screen can display several different interfaces. Typically, the touch screen interface comprises virtual buttons that can be activated by pressing a region on the screen representing a button with the user's finger or a stylus.

Although touch screens provide great efficiency and flexibility, many users do not like using touch screens. Instead, they prefer the tactile feel and response provided by hard buttons (e.g., physical buttons, detent buttons, depressible buttons, etc.). On reason for this is that physical buttons typically have a distinctive feel to which a user can learn to be accustomed. This allows a user to navigate and operate the control without looking down at the interface. That is not practical with "soft" buttons.

However, each physical button occupies physical space on the device. Due to inherent space limitations of small portable devices, these devices cannot afford to have separate dedicated control interfaces for each component without sacrificing the small size required for portability. Rather, these devices must use one control interface and assign more than one function to each physical button in the control interface. For example, a physical button that may correspond to the letter "S" button on a control interface for controlling PDA functionality may also serve double duty as the "4" button for phone operation. This multi-duty assignment is indicated by marking the button appropriately. The more functions that are assigned to a button, however, the more markings that must be printed on the button. This may lead to very "busy-looking" and confusing button layouts.

Therefore, what is needed is a system and method for providing a multi-functional user control interface using physical interaction devices whose layout reduces confusion to a user.

SUMMARY

One embodiment of the present invention provides a user control interface for controlling multiple device functionality comprising a support structure, control regions, depressible interaction devices, and a controller. The control regions are formed on the support structure. Each of the control regions comprises light emitting areas. The depressible interaction devices cover respective ones of the control regions. The controller is coupled to the control regions and controls which of the emitting areas is output from respective ones of the interaction devices based on one or more modes of operation of the user control interface.

Another embodiment of the present invention provides a method for using a user control interface that controls multiple device functionality. A first set of openings of a first set of depressible interaction devices is illuminated during a first mode of operation. A second set of openings of one of the first set or a second set of depressible interaction devices is illuminated during a second mode of operation. The second set of openings can include all, none, or part of the first set of openings.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1, 2, 3, and 4 show various illumination configurations of interaction devices or buttons for various modes of operation of a user controller interface, according to one embodiment of the present invention.

Figure 15:
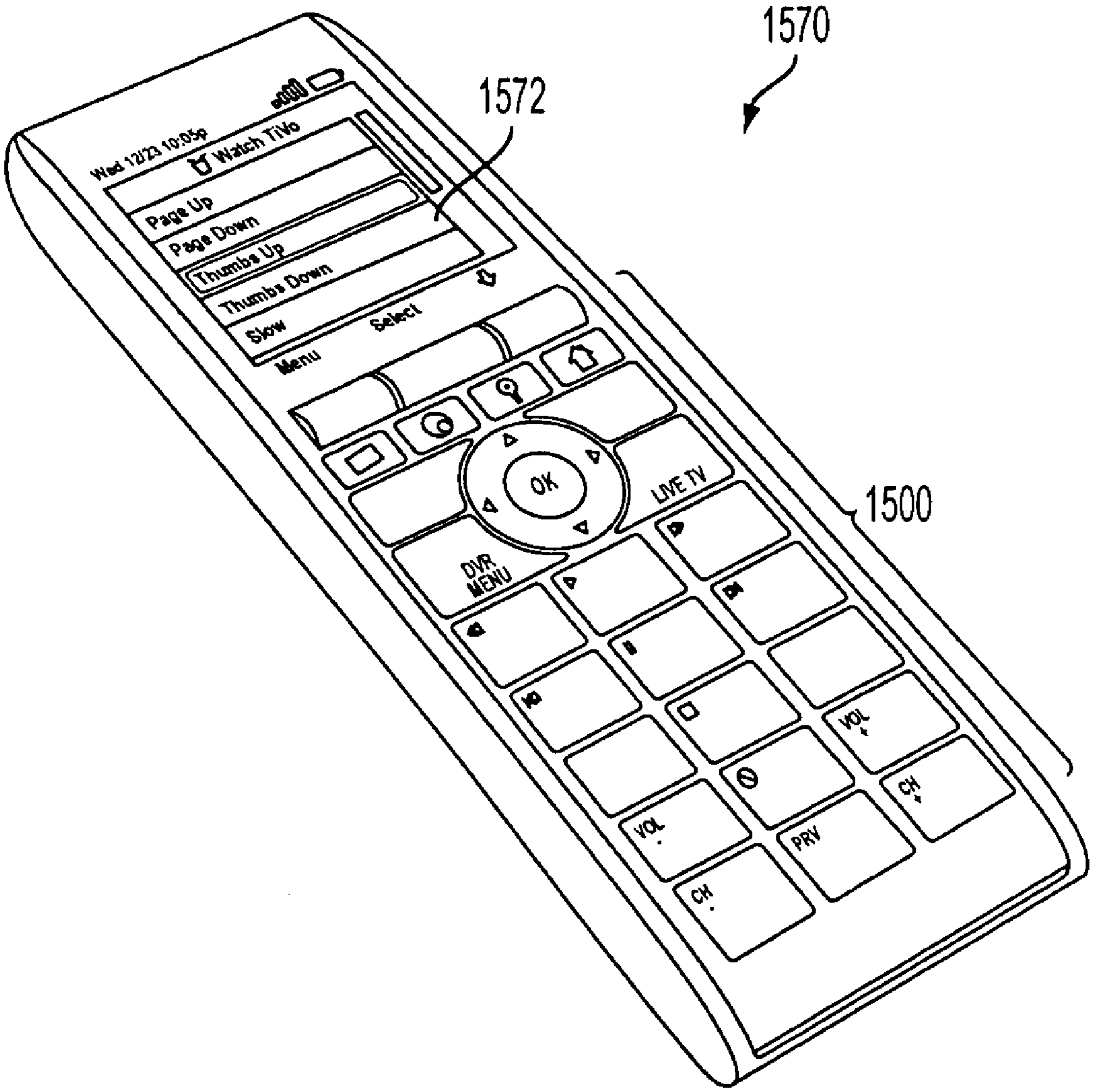
Figure 16:
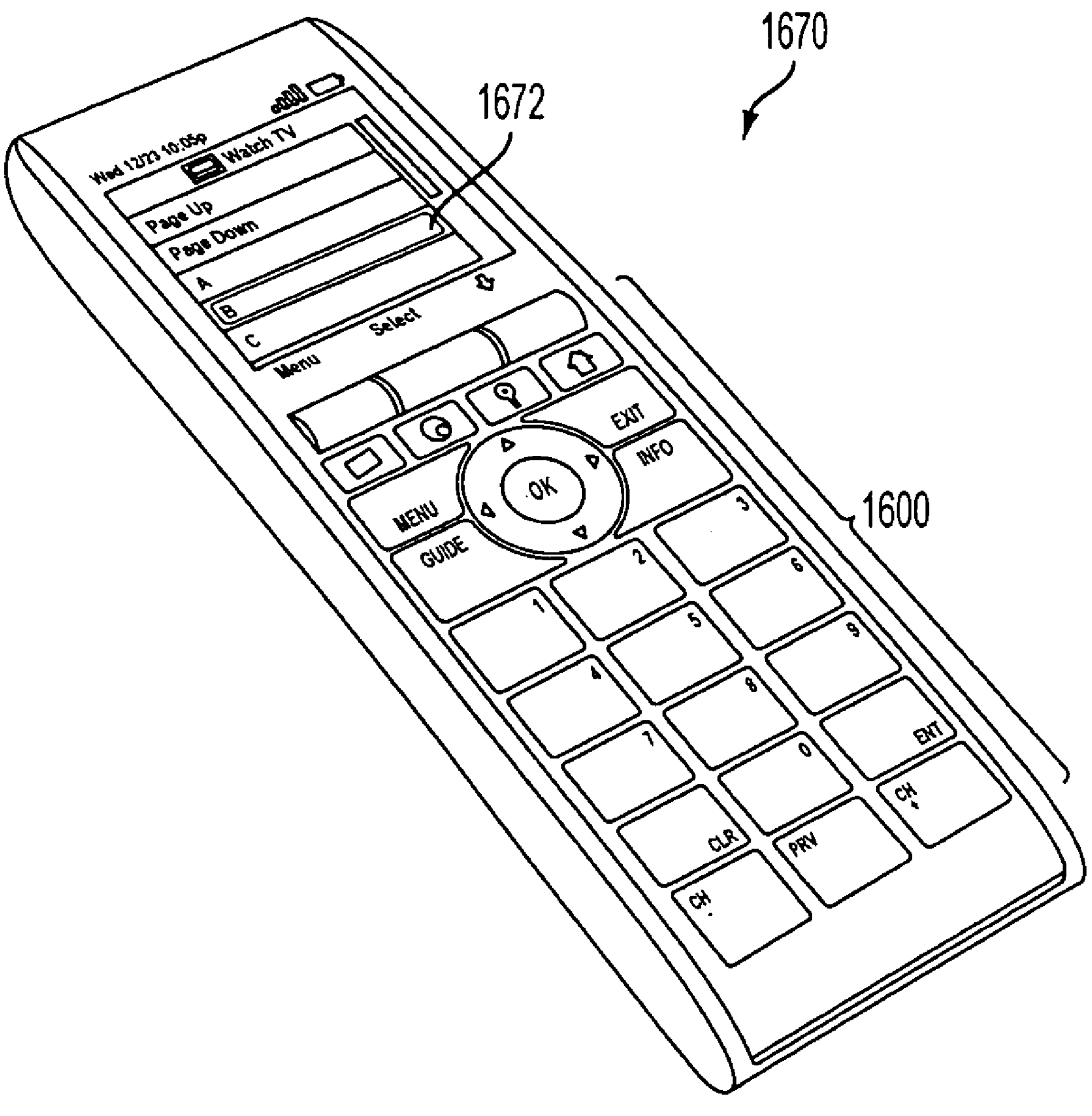
Figure 17:
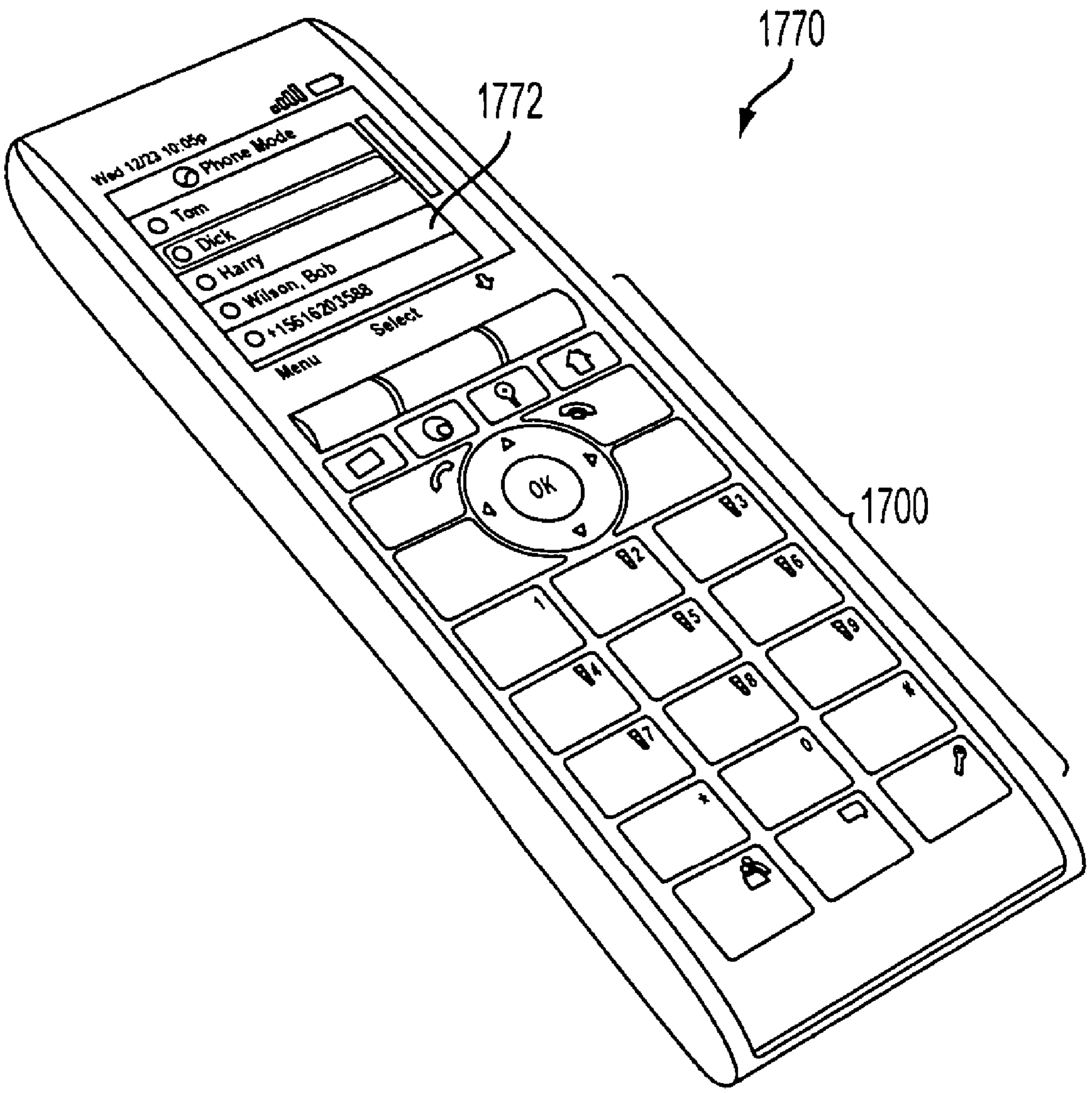

FIGS. 15, 16, and 17 show a multi-functional device having an interface and a display functioning in various modes of operation, according to one embodiment of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed herein, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Overall Interface

FIGS. 1, 2, 3, and 4 show various illumination configurations of interaction devices 102 (e.g., buttons, physical buttons, detent "soft" buttons, depressible buttons, or the like) for various modes of operation of a user controller interface 100, according to one embodiment of the present invention. User controller interface 100 can be associated with and used to control a multi-functional device, such as a remote control unit for controlling multiple CE devices that also has voice telephony functionality.

Figure 1:
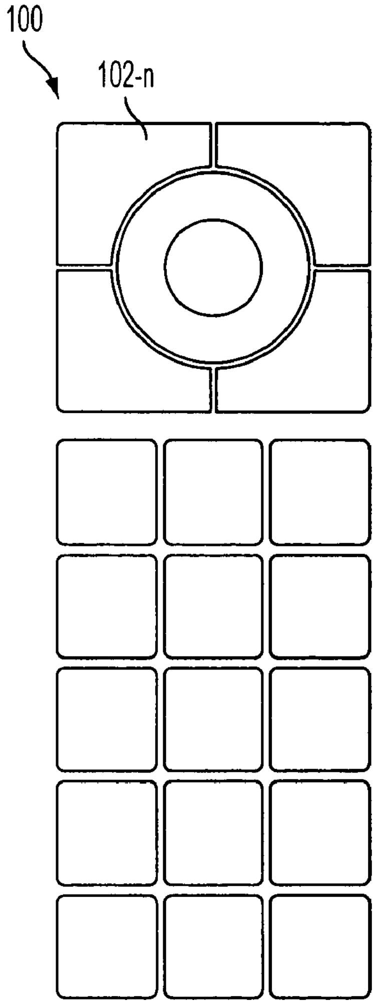

FIG. 1 shows an arrangement of buttons 102 for a multi-functional device in rest mode, in which none of buttons 102 are illuminated.

Figure 2:
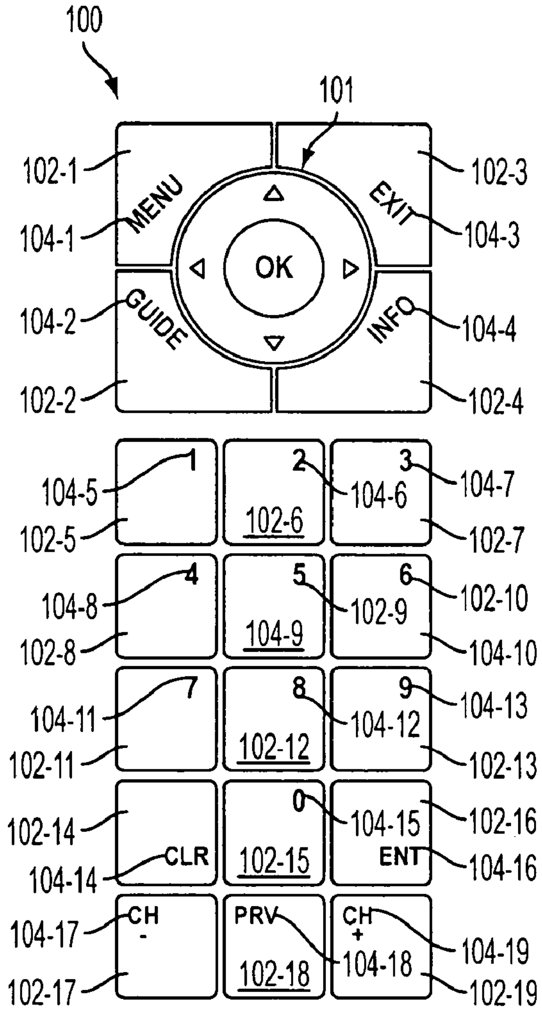

FIG. 2 shows a "channels" arrangement of illuminated buttons 102 for operating a television, cable box, set-top box, audio receiver, or the like. The operations that are available to the user are illuminated in a set of illumination areas (designated in FIG. 2 with reference numbers "104-*n*" (where n≧1)) on their respective buttons (designated with reference numbers "102-*n*" (where n≧1)). In this example, illumination area 104-1 displays the "MENU" function, indicating that an on-screen menu will appear on an associated display when button 102-1 is depressed. Similarly, buttons 102-2 to 102-4 provide well-known interactive viewing functions as shown in illumination areas 104-2 to 104-4. Specifically, illumination area 104-2 on button 102-2 displays the "GUIDE" function for obtaining programming information; illumination area 104-3 on button 102-3 displays the "EXIT" function for exiting a screen or mode; and illumination area 104-4 on button 102-4 displays the "INFO" function for accessing information relating to the program being viewed by the user. Buttons 102-1 through 102-4 circumscribe a directional or "D" pad 101 for navigating and selecting menu items.

Buttons 102-5 through 102-13 and 102-15 operate to enter numbers. Button 102-14 operates to clear an entry. Button 102-16 operates to exit a screen. Buttons 102-17 and 102-19 operate to move a channel up and down. Button 102-18 operates to return the screen to a previous screen. All these functions are illuminated in corresponding illumination areas 104-5 to 104-19.

Figure 3:
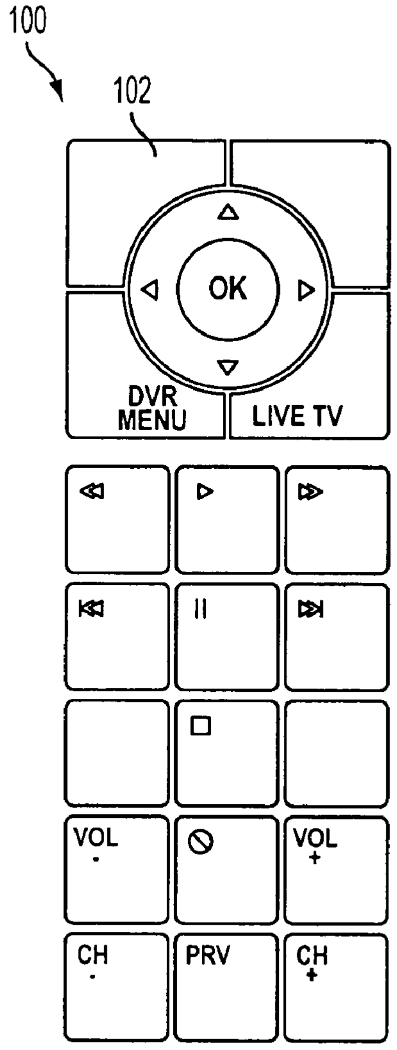
Figure 4:
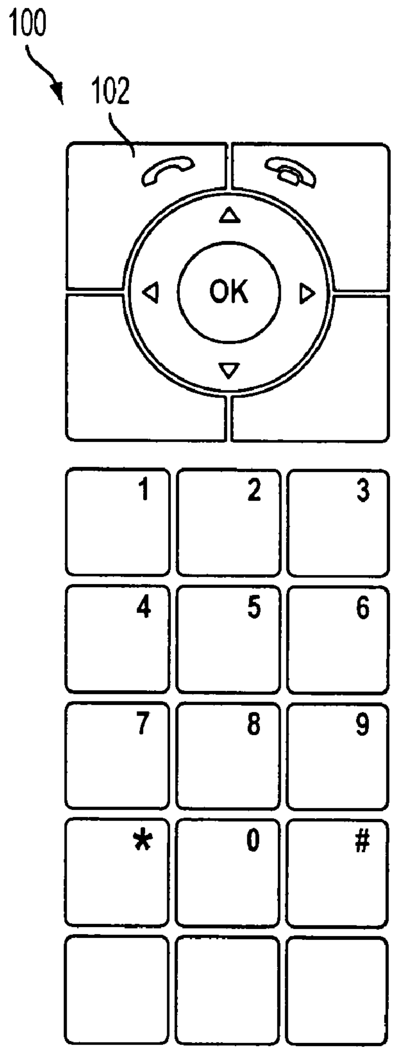

It is to be appreciated that FIGS. 3 and 4, each of which depict a user interface identical to the user interface 100 shown in FIG. 1, employ the same button reference scheme (102-1 to 102-*n*) and illumination area reference scheme (104-1 to 104-*n*) as used in FIG. 1. The reference numbers are not labeled on FIGS. 3 and 4 for simplicity and convenience.

FIG. 3 shows the user interface 100 illuminated for the "transport" mode used for controlling the operation of a device such as a digital video recorder (DVR). In this exemplary configuration, illumination area 104-2 of button 102-2 displays the "DVR MENU" function for accessing an on-screen operational menu upon activation of button 102-2, and illumination area 104-4 of button 102-4 displays the "LIVE TV" function for viewing programs via the TV tuner. Buttons 102-5 through 102-10 and 102-12 provide well-known functions to control viewing of recorded content (i.e., rewind, play, fast forward, previous/replay, pause, next/skip, and stop, respectively). Buttons 102-13 and 102-15 operate to control volume. Buttons 102-17 and 102-19 operate to control channel movement during live TV. Button 102-18 operates to return to the channel previously viewed by the user. These functions are displayed to the user via respective 104-*n* illumination areas, as shown.

FIG. 4 shows the user interface 100 illuminated for the "phone" mode for voice telephony operation. In this configuration, buttons 102-1 and 102-3 operate to control "picking up" and "hanging up" of the telephone, buttons 102-5 through 102-13 and 102-15 operate to correspond to a normal telephone keypad, and buttons 102-14 and 102-16 operate to correspond to the star (*) and pound (#) keys on a normal telephone keypad. These functions are displayed to the user via respective 104-*n* illumination areas, as shown.

Thus, the present invention provides a single user interface comprised of hard buttons that can be automatically configured through selective illumination to control a multi-function device that operates in multiple modes, including, but not limited to, a rest mode, channel mode, transport mode, and phone mode. The foregoing description is merely illustrative, and the number and type of functionality control and modes is application dependent, and merely exemplary in this embodiment.

Exemplary Control Regions

Figure 5:
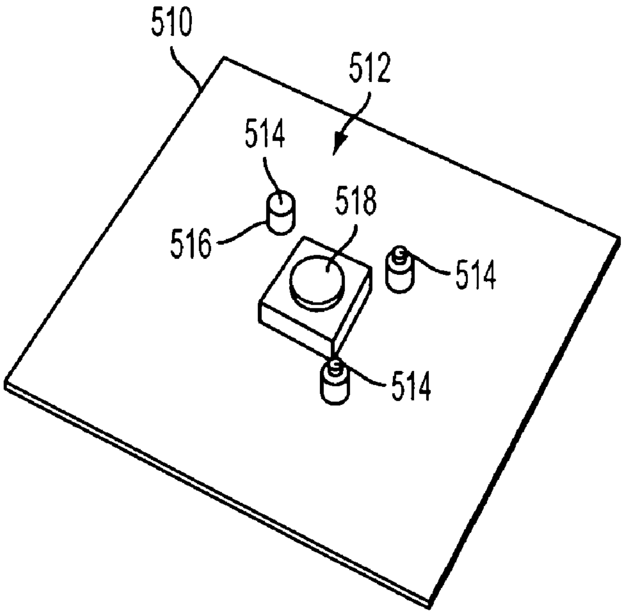
FIGS. 5 and 6 show a perspective and exploded view, respectively, of a support device and control regions, according to one embodiment of the present invention.
Figure 6:
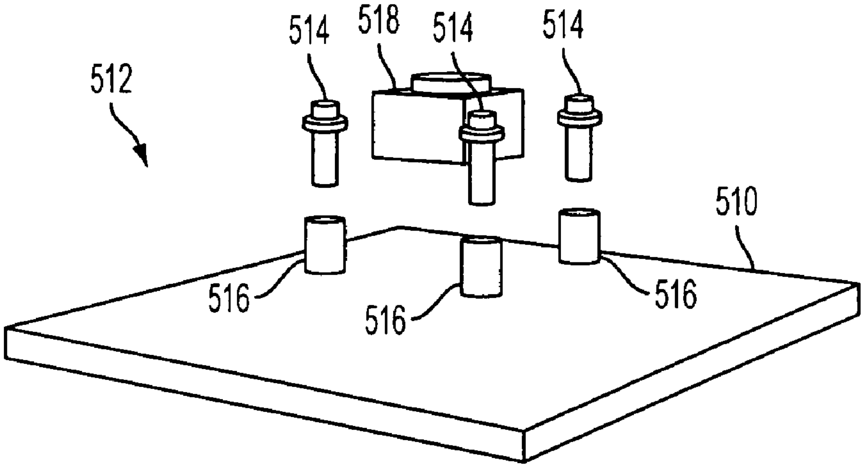

FIGS. 5 and 6 show a perspective and exploded view, respectively, of certain structural elements of a button comprising the user interface 100 of the present invention. Each button has an assembly 512 arranged on a support layer 510 that is part of the multi-functional device controlled by interface 100. According to one embodiment of the present invention, each button comprises an arrangement of one or more mono-colored or multi-colored light sources, such as light panels (e.g., an electroluminescent (EL) display) or light-emitting diodes (LEDs) 514, which are mounted within opaque stalks/spacers 516 located on the support layer 510. In addition to physically housing the LEDs, the stalks/spacers 516 also prevent light emitted from the LED from emanating in a lateral direction. Other types of light sources or light pipes, or the like, can be used instead of LEDs. The number of LEDs 514 assigned to a button may correspond to the number of functions/modes of operation that can be performed by the multi-functional device in the case where each LED is dedicated to illuminate a single functionality of the device. Alternatively, a light pipe can be used to transfer the light of a single LED to multiple illumination areas, diminishing the number of LEDs required.

Additionally, for each button, a switch 518 is placed on support layer 510 that provides electrical connectivity to the underlying circuitry (not shown) of the multi-function device. Accordingly, when button 102 is depressed, it activates a respective switch 518 to initiate an operation corresponding to the function displayed in illumination area 104 of that button 102. The exact function will depend on the mode of operation of the multi-functional device at the time of activation.

First Embodiment of Buttons According to the Present Invention

Figure 7:
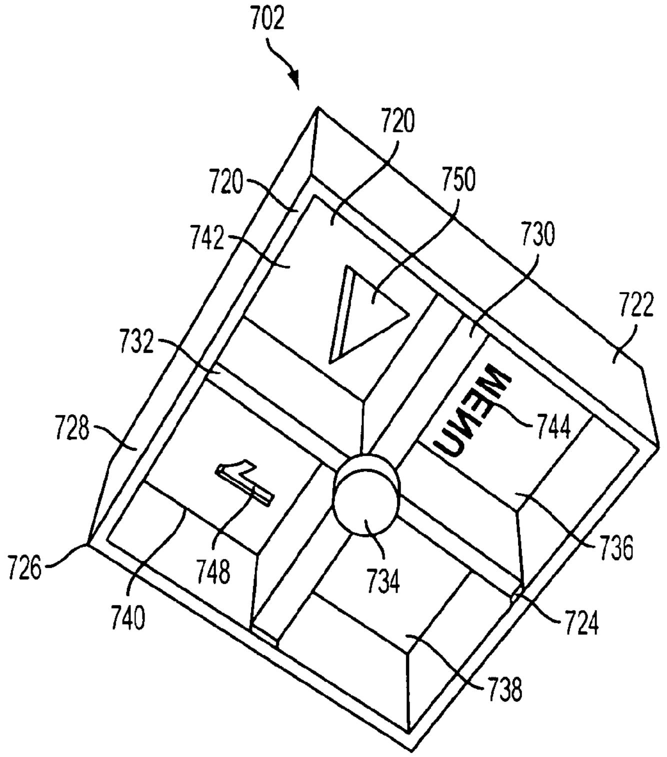
FIGS. 7 and 8 show bottom and top views, respectively, of an interaction device, according to one embodiment of the present invention.
Figure 8:
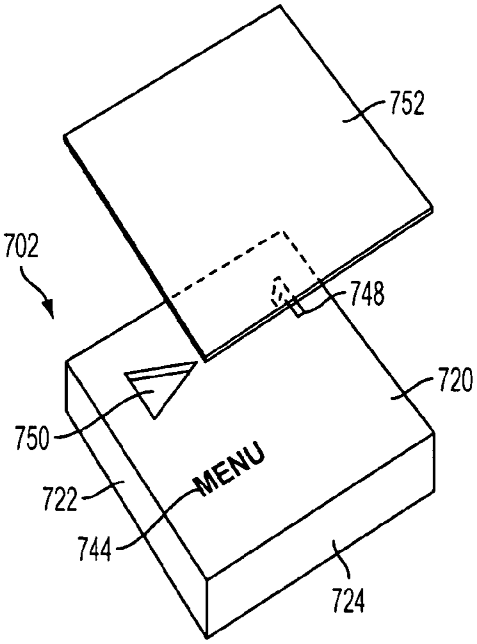

FIGS. 7 and 8 show bottom and top views, respectively, of a hard cap or cover 702, which is an additional component of a button comprising the user interface 100 according to one embodiment of the present invention. Each hard cap 702 comprises a surface wall 720, four side walls 722, 724, 726, and 728, and at least one partition wall 730 (although two partition walls 730 and 732 are shown in FIG. 7). Partition walls 730 and 732 form internal sections or cavities 736, 738, 740, and 742. Located with respect to at least one partition wall 730 or 732 is an extension or protrusion 734 that extends beyond the bottom surface of the partition walls 730 and 732. In one example, extension 734 is a stem coupled to surface wall 720 that passes through partition walls 730 and 732, while in another example extension 734 is coupled to one of the partition walls 730 or 732.

In accordance with the present invention, a hard cap 702 is mounted over the LED-switch assembly 512 shown in FIGS. 5 and 6 such that (i) each section or cavity 736, 738, 740, and 742 of hard cap 702 houses a light source 514 and corresponding stalk/spacer 516, and (ii) extension 734 of hard cap 702 makes contact with switch 518. Sections or cavities 736, 738, 740, and 742, which are formed by sidewalls 722, 724, 726, 728, 730, and 732, also function to prevent light emitted from an illuminated light source 514 in one of section or cavity 736, 738, 740, and 742 of hard cap 702 from entering into another section or cavity.

Hard cap 702 may be molded into its shape with certain openings 744, 748, and 750 formed in surface wall 720. For example, opening 744 in section 736 of the hard cap 702 shown in FIG. 7 is molded into the word "MENU." Opening 748 in section 740 of hard cap 702 is molded into the number "1," and opening 750 in section 742 is molded in the arrow symbol for the "play" operation. In this embodiment, hard cap 702 has no opening molded into surface wall 720 in the area of section 738. It should be noted that instead of complete openings, openings 744, 746, and 750 can be covered by transparent/translucent labels physically inserted into surface wall 720 of the button 702.

A thin film layer 752 is coupled to or formed on a top surface of surface wall 720 of each button 702. Layer 752, which can be made from a semi-opaque material, optically hides openings or labels 744, 746, and 750 when the corresponding light source 514 underneath is not illuminated. When user interface 100 is not in use, i.e., in rest mode, layer 752 gives each button of user interface 100 the appearance of a flat, smooth, and blank surface (see FIG. 1). During other modes, such as the channel, transport, and phone modes, layer 752 allows light from the underlying light source 514 (FIGS. 5 and 6) to pass through when the light source 514 is illuminated, thereby revealing the corresponding opening or label 744, 746, or 750 to the user.

Second Embodiment of Buttons According to the Present Invention

Figure 12:
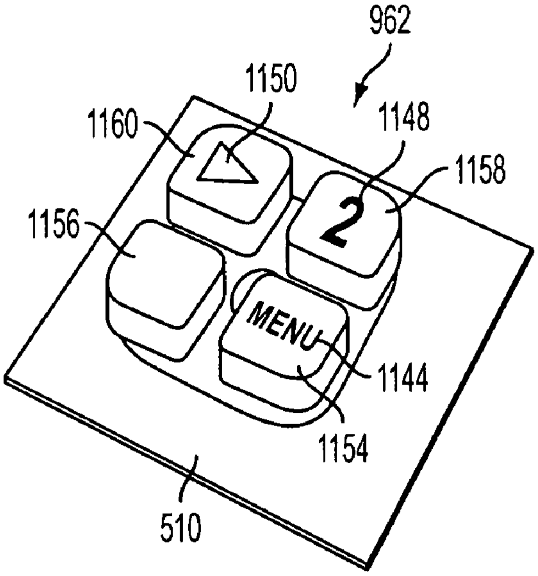
FIGS. 12 and 13 show a view of before and after an interaction device is placed around an insertable device, according to one embodiment of the present invention.
Figure 13:
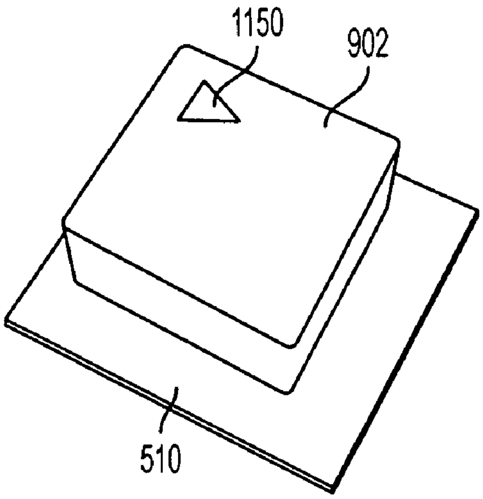

Reference is made to FIGS. 12 and 13 in connection with the following description of an alternative structure for the buttons of the present invention. As illustrated in FIG. 12, piece 962 comprises four hollow prongs or members 1154, 1156, 1158, and 1160 that extend from base layer 510. Piece 962 is made from a flexible translucent, light-diffusing material.

FIG. 13 shows a button cap 902 that is designed to fit over piece 962. Button cap 902 is made from a hard, semi-opaque material and serves as an outer shell for piece 962.

Figure 9:
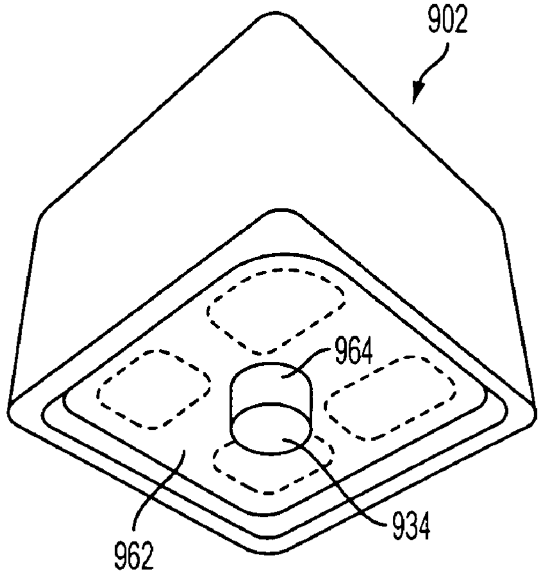
FIG. 9 shows a bottom view of an interaction device, according to one embodiment of the present invention.
Figure 10:
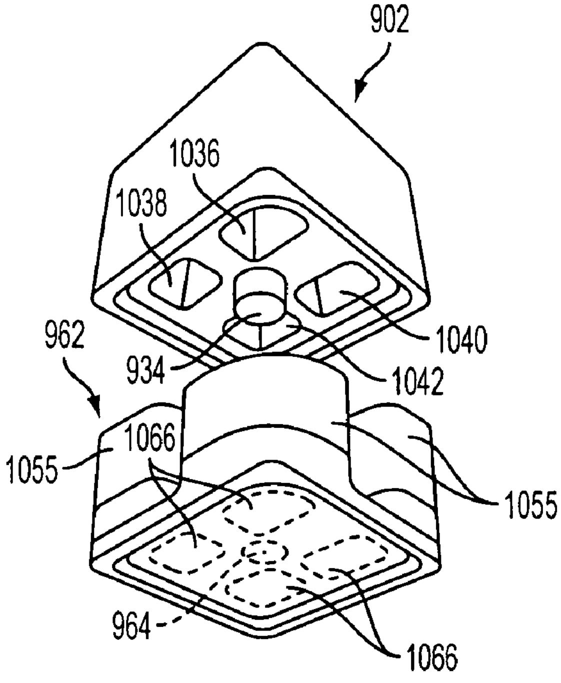
FIGS. 10 and 11 show various exploded views of the interaction device in FIG. 9.

FIG. 9 shows a bottom view of a piece 962 inserted into button cap 902, according to one embodiment of the present invention. FIG. 10 shows an exploded views of the button comprising button cap 902 and piece 962.

As shown in FIG. 10, piece 962 includes several members or prongs 1055 that have hollow cavities 1066. Similarly, button cap 902 has hollow cavities 1036 to 1042. Piece 960 is inserted into button cap 902 such that prongs 1055 are received within respective or corresponding sections 1036 to 1042 of button cap 902. FIG. 9 shows piece 962 after it is properly mated with button cap 902. Stem 934 is shown protruding from the bottom surface of piece 962 so that it can interact with the underlying switch 518 on base layer 510.

Figure 11:
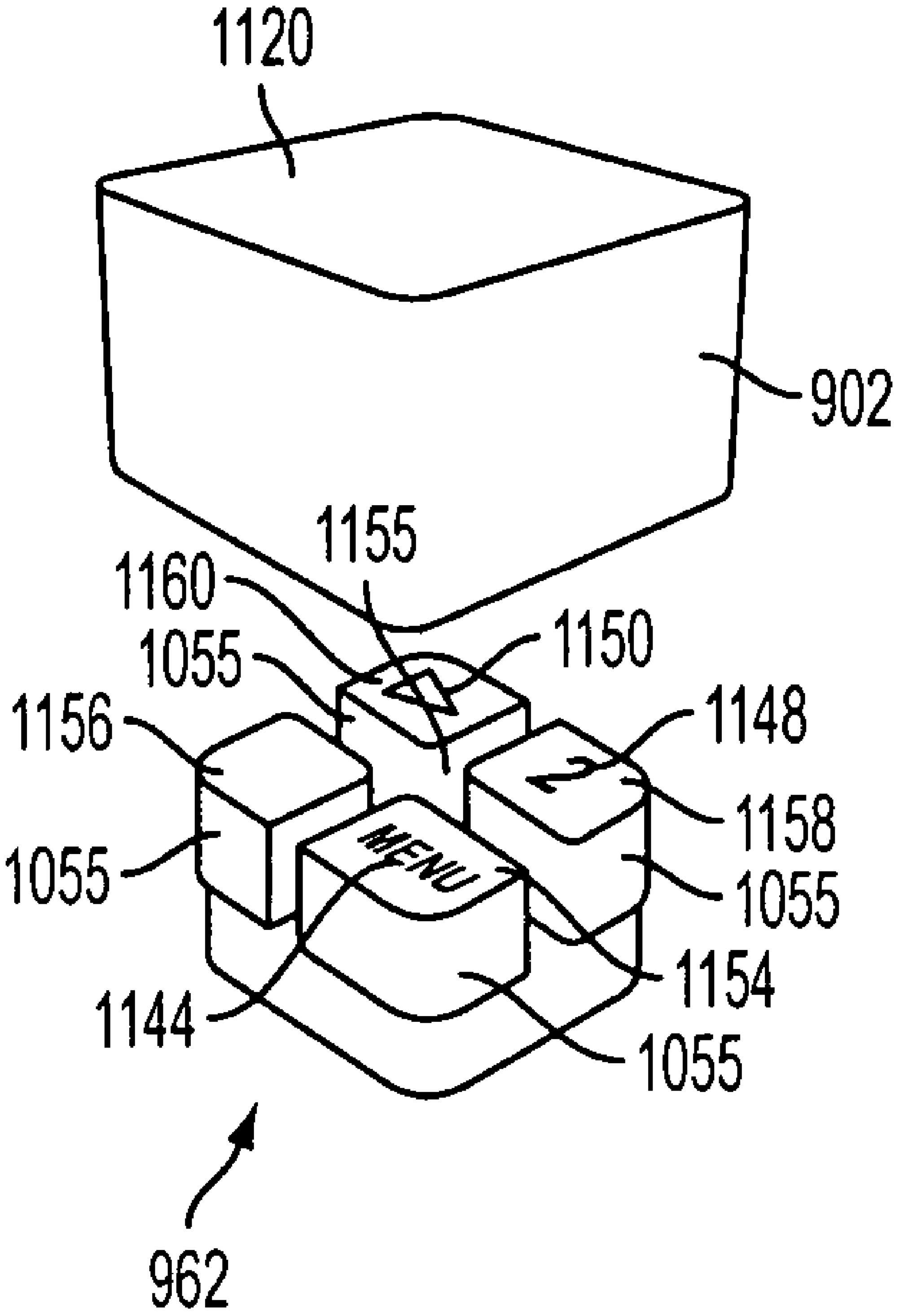

FIG. 11 shows a different perspective of piece 962 positioned underneath button cap 902 prior to insertion therein. In contrast to the button cap shown in FIGS. 7 and 8, which has openings molded into the surface wall 1120 of the cap, button cap 902 in FIG. 11 has no openings or other labeling or marks. Rather, as shown in FIG. 11, labels 1144, 1148, and 1150 are formed on respective surfaces 1154, 1158, and 1160 of prongs 1055 of piece 962. In one example, respective top surfaces 1154 to 1160 of each prong 1055 are marked with labels 1144 to 1150 using a negative-image technique (e.g., silkscreen), such that the label itself remains translucent and surrounding areas are covered in black.

Figure 14:
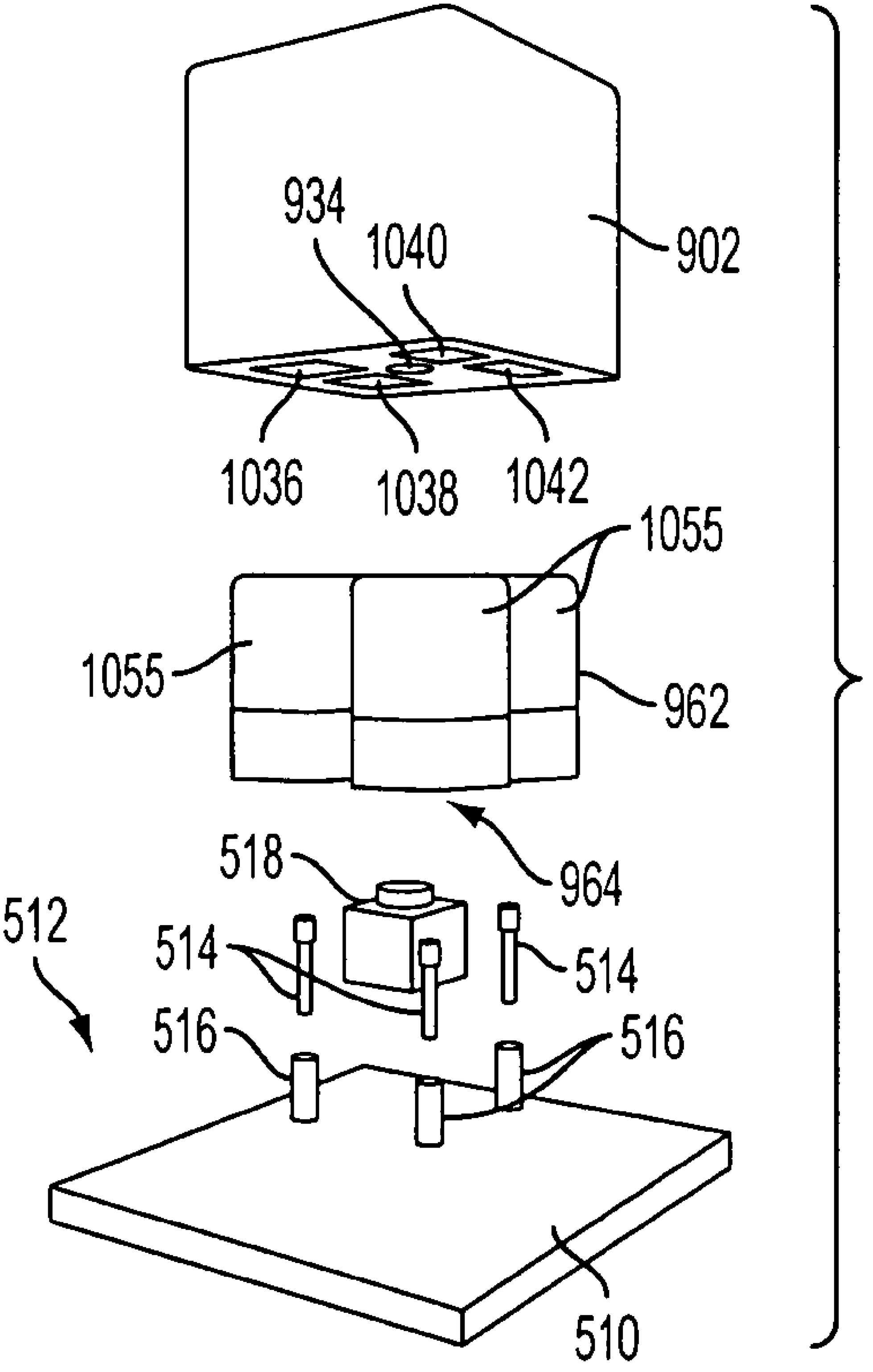
FIG. 14 shows an exploded view of a portion of a user controllable interface, according to one embodiment of the present invention.

FIG. 14 shows an exploded view of a portion of a user controllable interface, according to one embodiment of the present invention. In this example, piece 962 fits over LED-switch assembly 512 on base layer 510, such that each cavity 1066 in each prong 1055 of piece 962 receives a respective light source 514 and spacer 516 pair therein. As a result, each LED 514 is located inside a respective cavity 1066 of a prong 1055 of piece 962. Piece 962 is in turn inserted into hard cap 902, such that each prong 1055 of piece 962 is received into a corresponding cavity 1036 to 1042 of hard cap 902. Accordingly, extension 934 of hard cap 902 passes through an opening 964 in the piece 962 and is aligned with and makes contact with switch 518 on base layer 510. When the button is depressed, extension 934 interacts with switch 518, which has connectivity to a circuitry layer (not shown) below base layer 510.

In one example, labels 1144, 1148, and 1150 are not visible by the user though button cap 902 when the LEDs 514 are not illuminated (see, e.g., FIG. 1). However, when one LED 514 is illuminated, the light therefrom travels though a respective one of labels 1144, 1148, and 1150 and through button cap 902 so that the label is revealed to the user (e.g., see FIGS. 2, 3, and 4). For example, FIG. 12 shows prong 1160 of piece 962 with a "play" arrow label 1150, which is illuminated by an underlying light source. The light emitting from illuminated play label 1150 passes through and is visible through button cap 902, which is made from a semi-opaque material, as shown in FIG. 13.

FIGS. 15, 16, and 17 show a multi-function device 1570 having an interface 1500 and a display 1572, functioning in various modes of operation. The interface 1500 is a keyboard comprising an array of hard buttons in accordance with the present invention. In FIG. 15, the interface 1500 of device 1570 is shown illuminated in accordance with a "transport" mode of operation for control of a DVR. In FIG. 16, the interface 1600 of device 1670 is shown illuminated in accordance with a "channels" mode of operation for control of a TV. In FIG. 17, the interface 1700 of device 1770 is shown illuminated in a "phone" mode of operation for control of a phone.

In addition, display 1572 of device 1570 may display menus and other information relevant to the mode of operation of the device 1570. For example, in the transport mode, display 1572 may display a menu of commands relating to viewer interaction, such as "Thumbs Up" and "Thumbs Down." In the channels mode, display 1672 may display a menu of commands relating to the selection of favorite channels. In the phone mode, display 1772 may display a menu of commands relating to the selection of stored phone numbers.

The device 1570 is an exemplary platform on which the button interface 1500 of the present invention can be utilized. The present invention can be used on any other platform in which control of multi-device functionality is desired. Additionally, the present invention can be used in a computer keyboard to provide keys customizable for use in multiple languages (e.g., Cyrillic, Arabic, or Greek symbols) or for operating special applications or programs (symbols for photo editing or graphics design).

According to one or more examples and/or embodiments of the present invention, a device uses hard, detent, or physical buttons, each of which is configured with different operational labels that are invisible to the user until selectively illuminated by the device according to the device functionality at issue.

In one example, a mode of operation of remote control 1570, 1670, or 1770 (hereinafter, all referred to as 1570) can be controlled using a processor, digital signal processor, microprocessor, or the like (not shown). This can be based on underlying software, firmware, or both. For example, a user inputs information relating to a desired mode of operation via either display 1572, user controller interface 1500, or some other aspect of remote control 1570. Upon receipt of this information, the processor transmits signals to respective control regions 512. The signals are used to control which light source 514 in each respective control region 512 is illuminated for that particular mode of operation.

In another example, underlying functionality of remote control 1570 can be controlled using the processor. With reference, for example, to FIG. 14, when a depressible interaction device 902 is depressed, extension 934 contacts switch 518. Switch 518 generates a signal that is transmitted to the processor. The processor initiates an operation through underlying software, firmware, or both, that is associated with the respective switch 518 based on a current mode of operation.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A user control interface for controlling multiple device functionality, comprising:

control regions formed on a support structure, each of the control regions comprising respective light emitting areas;

depressible interaction devices coupled to respective ones of the control regions, each of the depressible interaction devices comprising, a first wall including a film layer;

second through fifth walls substantially perpendicularly coupled to the first wall, a sixth wall substantially perpendicularly coupled to the first wall and coupled between at least two of the second through fifth walls, and an extension extending with respect to the sixth wall, the extension interacting with the respective ones of the control regions;

an insertable device that is received within the depressible interaction device and aligned with a respective one of the light emitting areas, the insertable device comprising a number of insertable portions corresponding to a number of cavities formed by coupling the sixth wall to the first through fifth walls; and a controller coupled to the control regions and configured to control which of the emitting areas is output from respective one of the interaction devices based on one or more modes of the operation of the user control interface.

2. The system of claim 1, wherein a surface of each of the insertable portions includes an opening shaped to correspond to one or more modes of operation of the user control interface.

3. The system of claim 2, wherein the openings are visible only during a non-rest mode of the one or more modes of operation of the user control interface.

* * * * *